United States Patent
Maeda

(10) Patent No.: US 7,291,510 B2
(45) Date of Patent: Nov. 6, 2007

(54) METHOD FOR MANUFACTURING SEMICONDUCTOR DEVICE

(75) Inventor: Syuusaku Maeda, Kushikino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 11/188,601

(22) Filed: Jul. 25, 2005

(65) Prior Publication Data

US 2006/0115962 A1    Jun. 1, 2006

(30) Foreign Application Priority Data

Jan. 26, 2004   (JP)   ............... 2004-016814
Jan. 24, 2005   (JP)   ............... 2005-015098

(51) Int. Cl.
*H01L 21/00*  (2006.01)

(52) U.S. Cl. ............ 438/33; 438/42; 438/460; 438/462; 257/E21.001

(58) Field of Classification Search ............ 438/33, 438/462, 42
See application file for complete search history.

(56) References Cited

U.S. PATENT DOCUMENTS

| 6,261,856 B1 * | 7/2001 | Shinohara et al. ......... 438/30 |
| 6,677,173 B2 * | 1/2004 | Ota ....................... 438/22 |
| 6,794,272 B2 * | 9/2004 | Turner et al. ............ 438/459 |
| 6,956,241 B2 * | 10/2005 | Sugawara et al. .......... 257/79 |
| 2006/0153262 A1 * | 7/2006 | Barbieri et al. ........ 372/43.01 |
| 2006/0231852 A1 * | 10/2006 | Kususe et al. ............ 257/99 |

FOREIGN PATENT DOCUMENTS

| JP | 11-163403 | 6/1999 |
| JP | 11-177137 | 7/1999 |
| JP | 2001-284292 | 10/2001 |

* cited by examiner

*Primary Examiner*—Michael Lebentritt
*Assistant Examiner*—Angel Roman
(74) *Attorney, Agent, or Firm*—Hamre, Schumann, Mueller & Larson, P.C.

(57) ABSTRACT

The inventive method for manufacturing a semiconductor device is a method for manufacturing a semiconductor device using irradiation with laser light to partition a substrate having semiconductor layers formed thereon, with gallium contained in at least one of the substrate and the semiconductor layers, wherein the method comprises: forming grooves to be used as boundaries between individual substrates by irradiating the substrate along partitioning locations with laser light, immersing the substrate into an acid solution, and partitioning the substrate into individual substrates along the boundaries where grooves are formed. In this manner, it provides a method for manufacturing a semiconductor device in which, during the partitioning of a gallium-containing semiconductor device substrate, deposits of gallium compounds adhered during laser irradiation are removed, partitioning surfaces are formed flat and uniform, and the incidence of electrode continuity failures and resin peeling is low.

11 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, in which a laser beam is used to dice a substrate having semiconductor layers formed thereon, with gallium contained in at least one of the substrate and the semiconductor layers.

2. Description of Related Art

During the manufacture of light-emitting elements, which are an example of gallium-based semiconductor devices, circuits have to be formed on a wafer used as a substrate and light-emitting elements have to be produced by partitioning the substrate vertically and horizontally.

FIG. 5A-C illustrates a method for manufacturing light-emitting elements, which are an example of conventional semiconductor devices utilizing substrates on which semiconductor layers are formed, containing gallium.

A substrate 1 is formed from sapphire, a p-type semiconductor layer 3 and an n-type semiconductor layer 2 composed of gallium nitride are formed on the substrate 1 by epitaxial growth, using metal-organic chemical vapor deposition (MOCVD: metal-organic chemical vapor deposition), portions of the p-type semiconductor layer 3 are removed by reactive ion etching (RIE) to expose the n-type semiconductor layer 2, n-type electrodes 4 are formed on the exposed n-type semiconductor layer 2, and a reflective film 5b composed of rhodium and, on top of it, a p-type electrode 5a composed of gold, are formed on the p-type semiconductor layer 3 (FIG. 5A). The reflective film 5b reflects light generated by the p-type semiconductor layer 3 downward.

Next, grooves 10 are formed (FIG. 5B) on the substrate 1 using a dicing saw (not shown) and individual substrates 1a are obtained by partitioning along the grooves 10 (FIG. 5C).

In case of semiconductor devices utilizing gallium-arsenic, gallium-phosphorus, and similar substrates, the hardness of the substrates is not very high and partitioning is performed by dicing with a dicing saw. However, in case of substrates utilizing sapphire and gallium nitride, which have a high hardness and are difficult to dice using a dicing saw alone, a technique has been adopted, wherein grooves are formed with a dicing saw along the partitioning locations and the substrate is partitioned by a mechanical action using the grooves as boundaries.

Due to the high hardness of sapphire and gallium nitride, from which substrates in such conventional manufacturing methods are formed, the formation of the grooves used to be a time-consuming task and the blades of the saws used for dicing were heated to elevated temperatures and subjected to intense wear and tear, resulting in a high frequency of replacement and high costs. In addition, the high hardness of the substrates made it impossible to form deep grooves, and when partitioning was performed by splitting along shallow grooves, the cleavage surfaces were not flat and splitting tended to produce non-uniform fracture surfaces. FIG. 6A-B is an example of a semiconductor device with non-uniform fracture surfaces, wherein FIG. 6A is an overall view and FIG. 6B is an enlarged view of FIG. 6A. The problem was that when cleavage surfaces were non-uniform fracture surfaces, splitting could affect the substrates of the adjacent semiconductor devices.

To address this problem, proposals have been made to form the grooves using a laser beam from a YAG (Yttrium Aluminum Garnet) laser, etc. A laser beam can produce elevated temperatures locally and thus can form deep grooves quickly, thereby permitting partitioning of a semiconductor device substrate into individual pieces within a short processing time.

JP H11-163403A (paragraphs Nos. 0038-0043, FIG. 1) has disclosed a technology, in which one side of a substrate for nitride semiconductor devices is irradiated with a laser beam along vertical and horizontal transects to form scribe lines, whereupon grooves are formed on the other side with a dicer so as to match the scribe lines formed on the opposite side and the substrate for nitride semiconductor devices is partitioned.

In addition, JP H11-177137A (paragraphs Nos. 0042-0045, FIG. 1) has disclosed a technology, in which grooves are formed with a dicer on one side of a substrate for nitride semiconductor devices, cleavage grooves are then formed by irradiating the grooves with a laser beam, and the substrate for nitride semiconductor devices is partitioned along the cleavage grooves.

In addition, JP 2001-284292 (paragraphs Nos. 0027-0034, FIG. 1) has disclosed a method, wherein partitioning grooves are formed by irradiating the surface of the side, on which the semiconductor is formed of a semiconductor wafer, with laser light, and then partitioning is performed by subjecting the semiconductor wafer to thermal shock by bringing it in contact with liquid nitrogen so as to induce cracking along the partitioning grooves under the action of thermal stress.

However, the problem with the conventional method, in which grooves were formed by locally heating a substrate to an elevated temperature of 1000° C. or more by irradiation with a laser beam along partitioning locations and sublimating the gallium-containing compounds utilized in the substrate and the semiconductor layers deposited on the substrate, was that some of the sublimated gallium-containing compounds converted into gallium oxide and other gallium compounds (hereafter called "gallium compounds") and adhered to the substrate and to the electrodes.

The adhesion of the deposits of gallium compounds to the electrode 5a formed on the substrate caused various problems, such as decreased electrical conduction and reduced wire bond strength when bonding the electrodes of the semiconductor device to other electrodes and in case of wire bonding to other electrodes.

Another problem was that in the case where resin sealing is performed with such deposits still adhered to the substrates, gaps appeared between the substrate and the resin, which allowed moisture to penetrate inside and, upon heating, caused peeling due to interface contamination by the deposits.

SUMMARY OF THE INVENTION

The present invention provides a method for manufacturing a semiconductor device in which, during the partitioning of a substrate having semiconductor layers formed thereon, with gallium contained in at least one of the substrate and the semiconductor layers, partitioning surfaces are formed flat and uniform and the incidence of electrode continuity failures and resin peeling is low.

The inventive method for manufacturing a semiconductor device is a method for manufacturing a semiconductor device using irradiation with laser light to partition a substrate having semiconductor layers formed thereon, with gallium contained in at least one of the substrate and the semiconductor layers, the method comprising forming grooves to be used as boundaries between individual substrates by irradiating a substrate along partitioning locations with laser light, immersing the substrate into an acid solution, and partitioning the substrate into individual substrates along the boundaries where the grooves are formed.

DETAILED DESCRIPTION OF THE INVENTION

Figure 1A:
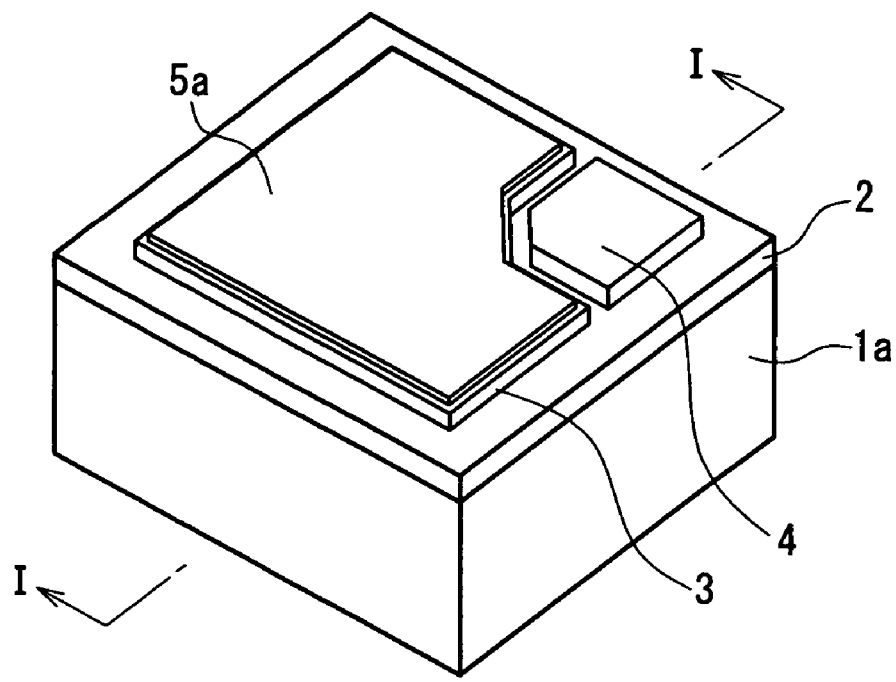
FIG. 1A is a perspective view explaining the configuration of a semiconductor device obtained by the semiconductor device manufacturing method used in the embodiments of the present invention.

In the present invention, in order to obtain a semiconductor device with flat and uniform cleavage surfaces and enable removal of deposits adhered during partitioning by irradiation with laser light when partitioning a substrate that has semiconductor layers formed thereon, with gallium contained in at least one of the substrate and the semiconductor layers, removal of deposits is accomplished by immersing a substrate having grooves serving as partitioning boundaries formed thereon by irradiation with laser light into an acid solution.

The present invention is a method for manufacturing a semiconductor device by partitioning a substrate having semiconductor layers formed thereon, with gallium contained in at least one of the substrate and the semiconductor layers, by irradiation with laser light, wherein the method for manufacturing a semiconductor device comprises forming grooves to be used as boundaries by irradiating the substrate along partitioning locations with laser light, immersing the substrate into an acid solution, and partitioning the substrate into individual substrates along the boundaries where the grooves are formed and enables removal of the gallium compounds, i.e. the deposits generated by irradiation with laser light, by immersion into an acid solution.

The substrate preferably is partitioned into individual substrates along the boundaries where grooves are formed after removing it from the acid solution. In this manner, immersion in the acid solution permits removal of the gallium compounds, i.e. deposits generated by irradiation with laser light.

After partitioning into individual substrates along the boundaries where the grooves are formed, the substrates preferably are immersed in an acid solution. In this manner, gaps are formed between the individual light emitting elements, and the gallium compounds, i.e. the deposits, can be removed efficiently.

The locations irradiated with laser light preferably have grooves formed by irradiation on the side opposite the side where the semiconductor layers are formed. In this manner, performing irradiation with laser light on the side opposite the side where the semiconductor layers are formed makes it possible to minimize the effects of heat on the semiconductor layers.

As far as the grooves are concerned, irradiation with laser light preferably is performed in an oblique direction so as to make the cross-section V-shaped. In this manner, by making the grooves quasi V-shaped, light intensity is increased because rendering the grooves quasi V-shaped makes it easier for light emitted inside the semiconductor layer to be output outside. With regard to the preferable angle of irradiation with laser light, it is preferable to use oblique irradiation at an angle in the range of from 20 to 60° relative to the normal of the substrate.

In locations irradiated with laser light, grooves preferably are formed by irradiation from the side of the face where the semiconductor layers are formed. Thus, irradiation with laser light can be carried out based on visual perception of the side of the face on which the semiconductor layers are formed, and partitioning locations on the substrate can be easily recognized.

The acid solution preferably is an aqueous solution of hydrochloric acid or an aqueous solution of nitric acid. In this manner, when immersed in hydrochloric acid, gallium compounds generated by irradiation with laser light are converted into gallium chloride by the hydrochloric acid and can be removed. With an aqueous solution of hydrochloric acid, the hydrochloric acid concentration preferably is in the range of from 10 to 35 wt %. With an aqueous solution of nitric acid, the nitric acid concentration preferably is in the range of from 5 to 20 wt %.

The semiconductor device preferably is a light-emitting element. In this manner, removing the deposits adhered to the light-emitting face of the light-emitting element prevents a decrease in intensity.

The grooves preferably extend to not less than 30% of the substrate thickness. In this manner, ensuring that the grooves extend to not less than 30% of the substrate thickness ensures the uniformity of the partitioning surfaces produced by the dicing of the substrate. More specifically, the depth of the grooves preferably is not less than 30 μm.

As explained above, the inventive method for manufacturing a semiconductor device offers a method for manufacturing a semiconductor device in which, during the partitioning of a substrate for semiconductor devices containing gallium, gallium compound deposits adhered during irradiation with laser light are removed, partitioning surfaces can be formed flat and uniform, and the incidence of electrode continuity failures and resin peeling is low.

Namely, a decrease in the bond strength of the electrodes formed on the substrate can be prevented because no deposits adhere to the electrodes formed on the substrate when individual substrates are formed. In addition, when substrates are sealed with resin, the removal of the deposits enables prevention of resin peeling etc. due to interface contamination.

In addition, when the semiconductor device is a light-emitting element, a decrease in the intensity of light emitted from the light-emitting face can be prevented because the gallium compounds adhered to the light-emitting face can be removed with the acid solution.

EMBODIMENTS

Hereinafter, embodiments of the present invention are explained specifically with reference to the drawings. The present invention, however, is not limited to the embodiments below.

Embodiment 1

Figure 1B:
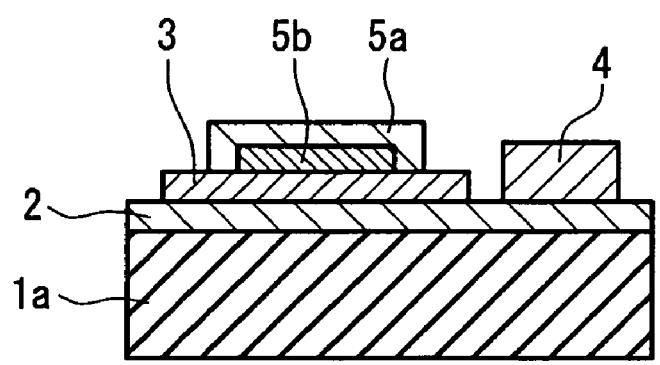
FIG. 1B is a sectional view taken along line I-I in FIG. 1A.

Explanations regarding a light-emitting element, as an example of the semiconductor devices obtained by the semiconductor device manufacturing method used in Embodiment 1 of the present invention, will be provided with reference to FIGS. 1A-B and FIGS. 2A-F. FIGS. 1A-B illustrate the configuration of a semiconductor device obtained using the semiconductor device manufacturing method used in the embodiments of the present invention. FIG. 2A-F illustrate a semiconductor device manufacturing method used in an embodiment of the present invention.

First of all, explanations will be provided based on FIG. 1A-B regarding the configuration of a light-emitting element, as an example of the semiconductor devices obtained using the semiconductor device manufacturing method used in the embodiments of the present invention.

As shown in FIG. 1A-B, in an individual light-emitting element produced by dicing (length: 350 µm, width: 350 µm, height: 100 µm), an n-type semiconductor layer 2 formed from gallium nitride is deposited on a substrate 1a formed from sapphire or gallium nitride, and a p-type semiconductor layer 3 formed from gallium nitride is deposited on the n-type semiconductor layer 2. An n-type electrode 4 is formed within the n-type semiconductor layer 2 region. A reflective film 5b composed of rhodium is formed within of the p-type semiconductor layer 3 region and a p-type electrode 5a composed of gold is formed on top of it. The reflective film 5b reflects light generated by the p-type semiconductor layer 3 downward.

When a positive pole is connected to the light-emitting element via the p-type electrode 5a and a negative pole via the n-type electrode 4 and an electric current is passed therethrough, emission takes place, with the light-emitting face being on the side opposite the face where the p-type electrode 5a and n-type electrode 4 are formed.

Next, explanations will be provided regarding a semiconductor device manufacturing method used in an embodiment of the present invention with reference to FIGS. 2A-F.

Figure 2A:
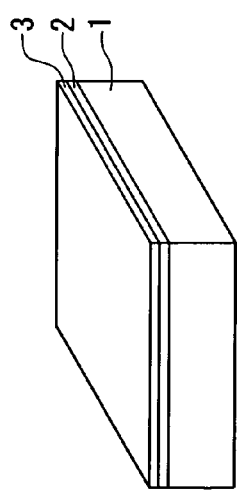
FIGS. 2A-F are perspective views explaining the semiconductor device manufacturing method used in Embodiment 1 of the present invention.

First of all, an n-type semiconductor layer 2 with a thickness of about 2.0 µm composed of gallium nitride (GaN) and aluminum gallium nitride (AlGaN) and a p-type semiconductor layer 3 with a thickness of about 0.5 µm composed of aluminum gallium nitride (AlGaN) and indium aluminum gallium nitride (InAlGaN) were formed by MOCVD etc. on a substrate 1 made of sapphire or gallium nitride with a thickness of 300 µm (FIG. 2A).

Next, the substrate 1, on which the n-type semiconductor layer 2 and p-type semiconductor layer 3 had been formed, was subjected to RIE in order to remove portions of the p-type semiconductor layer 3 and to expose the n-type semiconductor layer 2 and form various regions. A Pt layer with a thickness of about 0.001 µm and, on top of it, a rhodium layer of about 0.05 µm, were formed by vapor deposition on the p-type semiconductor layer 3 region in order to establish an ohmic contact with the p-type semiconductor layer, producing a dual layer structure acting as a reflective film 5b. A p-type electrode 5a composed of gold with a thickness of about 1.5 µm was formed on top of it by vapor deposition in order to facilitate wire bonding.

Figure 2B:
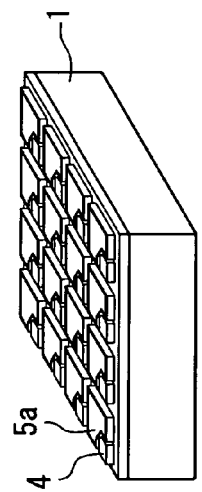

In addition, a Ti layer with a thickness of about 0.1 µm and, on top of it, a Au layer of about 1.5 µm, were formed by vapor deposition on the n-type semiconductor layer 2 region in order to establish an ohmic contact with the n-type semiconductor layer, producing a dual layer structure acting as an n-type electrode 4 (FIG. 2B).

Then, the substrate 1, on which the n-type electrode 4 and p-type electrode 5a had been formed, was polished on the face opposite the electrode face to a predetermined thickness (100 µm) (FIG. 2C). 1b designates a portion that was polished away. The polishing method comprised the steps of grinding, lapping, and polishing.

(1) Grinding

Using water and oil for cooling, the sapphire substrate is roughly polished with a diamond wheel etc. (a grinding stone made by baking diamond into bond material) so as to reduce the total thickness of the wafer from 300 µm to 150 µm.

(2) Lapping

To reduce the wafer layer thickness from 150 µm to 110 µm, the ground surface is subjected to intermediate polishing by dispersing a slurry produced by mixing diamond grains and oil using a copper-based surface plate.

(3) Polishing

To obtain a specular surface, final polishing to a thickness of 100 µm is carried out with water containing added $SiO_2$ on a surface plate covered with polishing fabric (cloth).

Figure 2C:
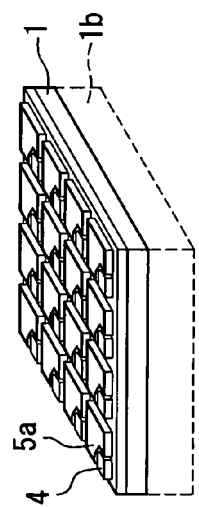
Figure 2D:
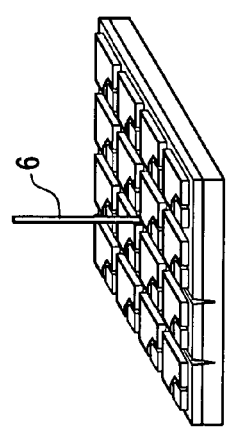

To obtain individual light-emitting elements, the substrate 1, which had been polished to a specified thickness, was irradiated with YAG laser light 6 along vertical and horizontal transects on the face that had the p-type electrode 5a and n-type electrode 4 formed thereon, and boundary grooves were formed with a depth of about 30% to 60% (30 to 60 µm) of the thickness of the substrate 1 and a width of 5 to 20 µm on the surface (FIG. 2D).

When the depth of the grooves is shallower than 30% of the thickness of the substrate 1, surfaces produced by partitioning along the boundaries during partitioning into individual substrates are not uniform and tend to be fracture surfaces. Because grooves deeper than 60% generate cracks in the substrate during immersion into the acid solution and increase the time required to form the grooves by irradiation with laser light, it is desirable to form grooves with a depth of from 30% to 60% of the thickness of the substrate 1.

When the YAG laser light 6 was used to irradiate the face of the substrate 1, on which the p-type electrode 5a and n-type electrode 4 had been formed, irradiation with laser light was performed based on visual perception and partitioning locations on the substrate could be easily recognized.

At such time, when gallium melts, evaporates, and undergoes an oxidation reaction due to irradiation with the YAG laser light 6, it produces gallium and compounds such as gallium oxide, which adhere to the slopes of the boundary-forming grooves, as well as to the p-type electrode 5a or n-type electrode 4, etc. (not shown in the figure).

Figure 2E:
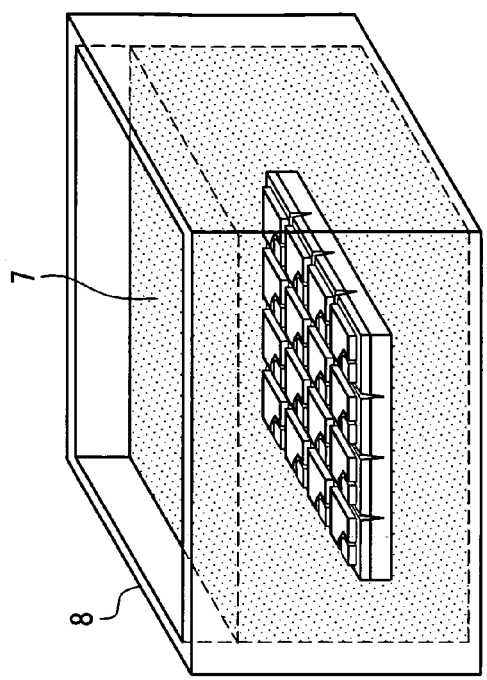

The substrate 1 on which the grooves were formed was immersed for 5 minutes into a solution tank 8 containing an aqueous solution of hydrochloric acid 7, i.e. an acid solution whose main ingredient was hydrochloric acid. The aqueous solution of hydrochloric acid 7 was obtained by diluting hydrochloric acid with a concentration of about 30 wt % with water to a hydrochloric acid concentration of 15 wt % and storing the solution at a temperature in the range of from room temperature (25° C.) to not more than 80° C. (FIG. 2E).

In this manner, for instance, when the gallium compound was gallium oxide, the gallium oxide of the deposits adhered to the slopes of the boundary-forming grooves was peeled off and removed based on a reaction represented by:

$$Ga_2O_3 + 6HCl \rightarrow 2GaCl_3 + 3H_2O.$$

Figure 2F:
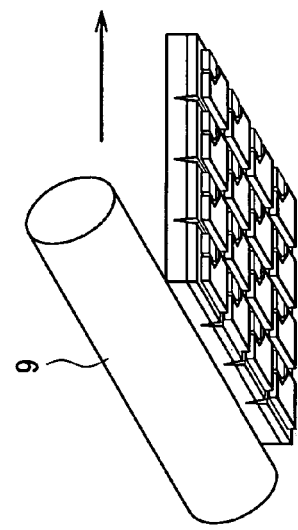

Finally, the substrate 1 on which the grooves were formed was removed from the aqueous solution of hydrochloric acid 7 in the solution tank 8 and washed with demineralized water, after which it was dried and a roller 9 was used to apply pressure to the side of the substrate 1 that was opposite the face on which the electrodes were formed (FIG. 2F). The pressure applied by the roller 9 resulted in partitioning into individual light-emitting elements by splitting along the boundary grooves.

In this embodiment of the present invention, partitioning into individual light-emitting elements is accomplished with the help of a roller, 9. However, partitioning into individual light-emitting elements also can be accomplished by applying pressure to the boundary grooves with a blade.

The removal of the deposit-forming gallium oxide is also possible if the acid solution contains nitric acid etc. as its main ingredient. In such a case, the adhered gallium oxide is peeled off and removed based on the reaction represented by:

$$Ga_2O_3 + 6HNO_3 \rightarrow 2Ga(NO_3)_3 + 3H_2O.$$

Embodiment 2

In the method for manufacturing a semiconductor device used in Embodiment 2 of the present invention, as shown in FIG. 2D, an n-type semiconductor layer 2 and a p-type semiconductor layer 3 are formed on a substrate 1 and grooves are formed by irradiating the face on which the n-type electrode 4 and p-type electrode 5a are formed with YAG laser light 6. However, irradiation with YAG laser light 6 also can be performed on the side opposite the side on which the n-type semiconductor layer 2 and p-type semiconductor layer 3 are formed.

Figure 3A:
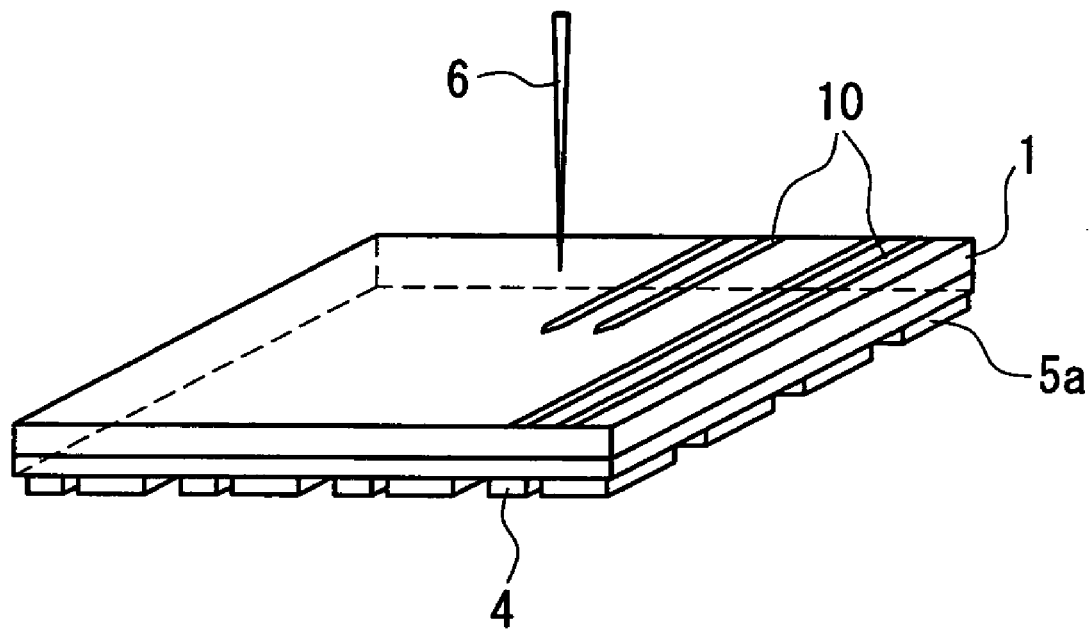
FIGS. 3A-B are perspective views explaining the semiconductor device manufacturing method used in Embodiment 2.

As shown in FIG. 3A, the grooves 10 were formed by irradiation with the YAG laser light 6 on the side opposite the side where the n-type electrode 4 and p-type electrode 5a were formed. Thus, forming the grooves 10 on the face of the substrate 1 that was opposite the face on which the electrodes were formed made it possible to form the grooves 10 without subjecting the interface between the n-type electrode 4 and p-type electrode 5a and the n-type semiconductor layer 2 and p-type semiconductor layer 3 to the effects of heat and produced high-intensity light-emitting elements.

Figure 3B:
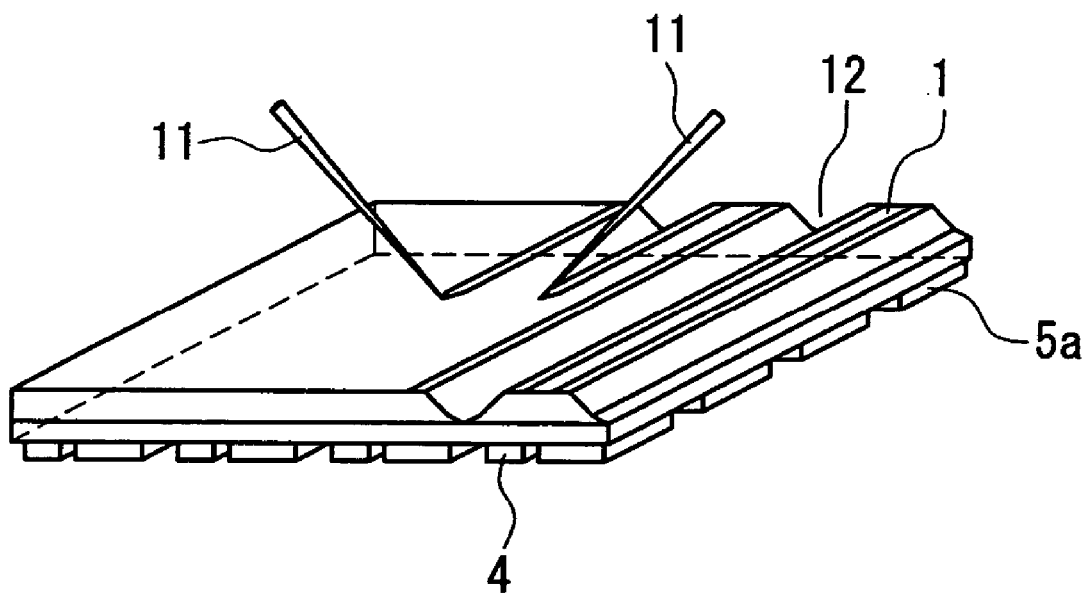

In addition, as shown in FIG. 3B, a groove 12 was formed by oblique irradiation with YAG laser light 11 on the face opposite the face on which the n-type electrode 4 and p-type electrode 5a had been formed. As for the preferable angle of irradiation with YAG laser light 11, oblique irradiation in the range of from 20° to 60° with respect to the normal of the substrate 1 is preferable.

As a result, light intensity was increased because forming the groove 12, which had a quasi V-shaped cross-section, by oblique irradiation with the YAG laser light 11 on the face opposite the electrode face of the substrate 1 made it easier for light emitted inside the semiconductor layer to be output outside.

In addition to the quasi V-shaped cross-sections, the cross-section of groove 12 can be formed with inclined and vertical slopes.

When grooves 10 and 12 illustrated in FIG. 3 are formed, it is desirable to form grooves with a depth of about 30% to 60% of the thickness of the substrate 1, in the same manner as in the case in which irradiation is performed on the electrode face of the substrate 1.

Embodiment 3

Next, the method for manufacturing a semiconductor device used in Embodiment 3 of the present invention is explained with reference to FIGS. 4A-H.

Figure 4A:
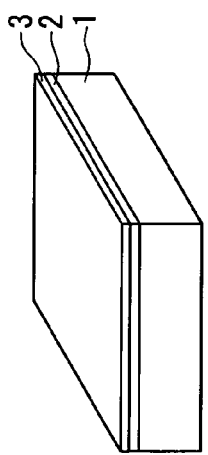
FIGS. 4A-H are perspective views explaining the semiconductor device manufacturing method used in Embodiment 3.
Figure 4B:
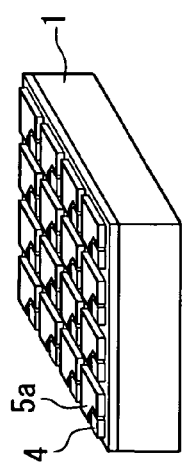
Figure 4C:
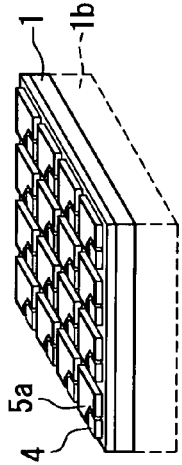
Figure 4D:
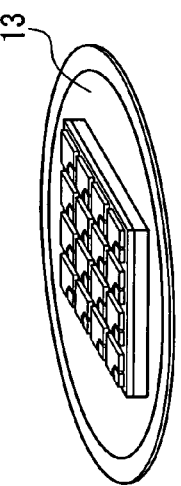

FIGS. 4A-C represent the same steps as FIGS. 2A-C, and therefore the corresponding explanations are omitted. In the steps depicted in FIGS. 4A-C, semiconductor layers and electrodes were formed on a sapphire or gallium nitride substrate, and, in order to separate the substrate 1, which had a predetermined thickness, into individual light-emitting elements, the face of the substrate that was opposite the face on which the p-type electrode 5a and n-type electrode 4 had been formed, was adhered to a dicing tape 13 made of polyethylene etc. (FIG. 4D)

Figure 4E:
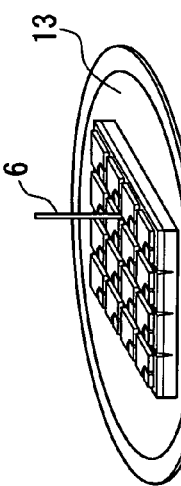

The face of the substrate 1 on which the p-type electrode 5a and n-type electrode 4 had been formed was irradiated along vertical and horizontal transects with YAG laser light 6 to form boundary grooves with a depth of at least 30% of the thickness of the substrate 1 (FIG. 4E).

Figure 4F:
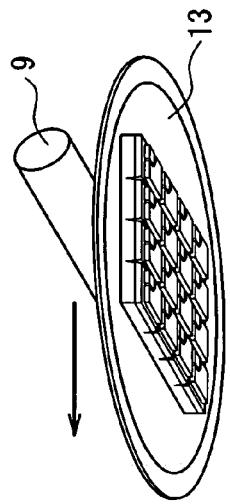
Figure 4G:
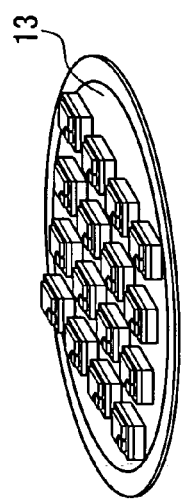

After forming the grooves, a roller 9 was used to apply pressure to the face of the dicing tape 13 opposite the face to which the substrate 1 was adhered (FIG. 4F). The pressure applied by the roller 9 resulted in partitioning into individual light-emitting elements by splitting along the boundary grooves.

Subsequently, after heating the dicing tape 13, the dicing tape 13 was secured in a state in which stretching-induced gaps were formed between the partitioned individual light-emitting elements (4G).

Figure 4H:
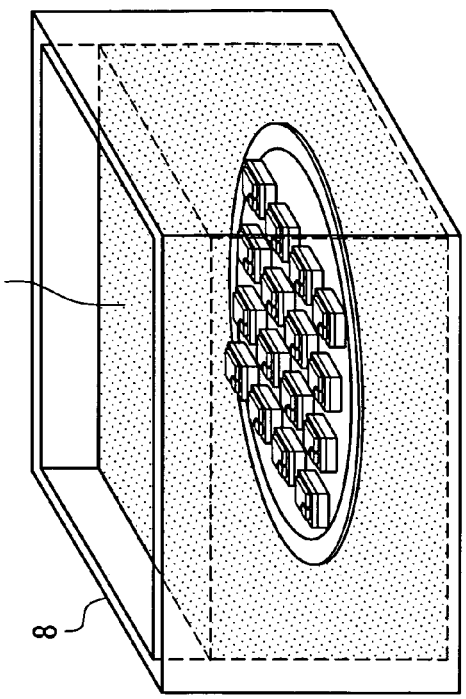
Figure 5A:
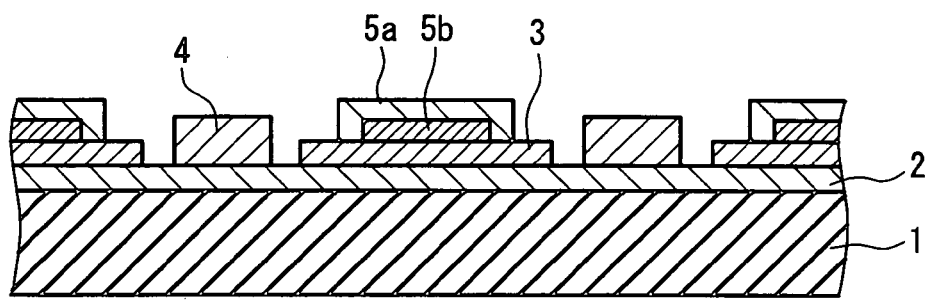
FIGS. 5A-C are cross-sectional views explaining the conventional method for manufacturing semiconductor devices.
Figure 5B:
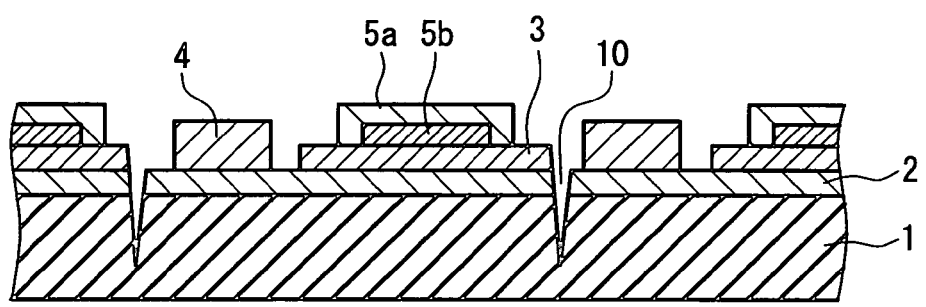
Figure 5C:
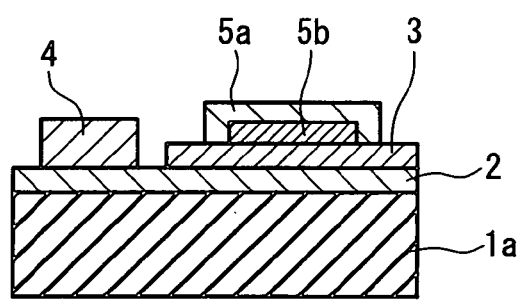
Figure 6A:
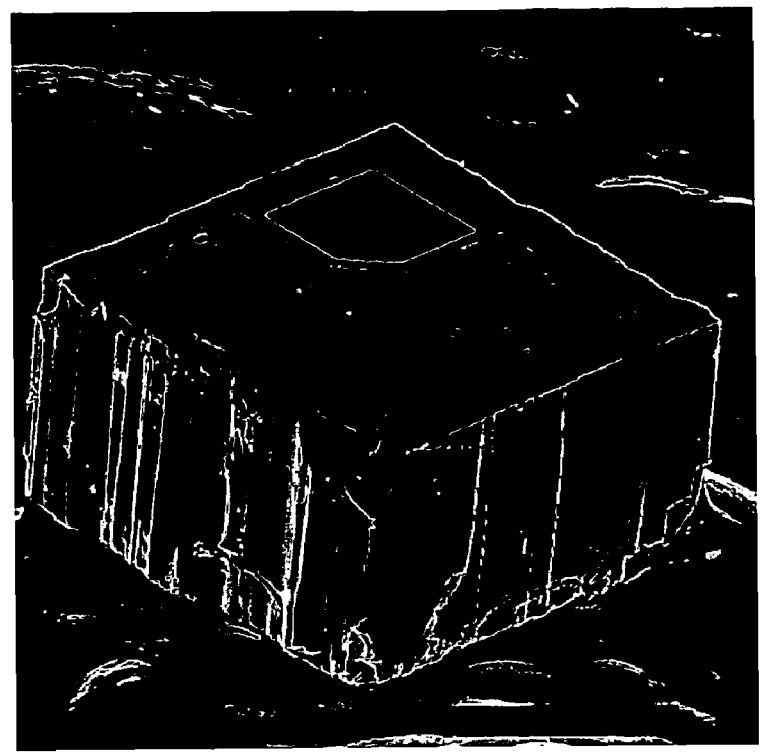
FIG. 6A is a photograph (magnification: about 86×) that illustrates the condition of a semiconductor device obtained by the conventional method for manufacturing semiconductor devices.
Figure 6B:
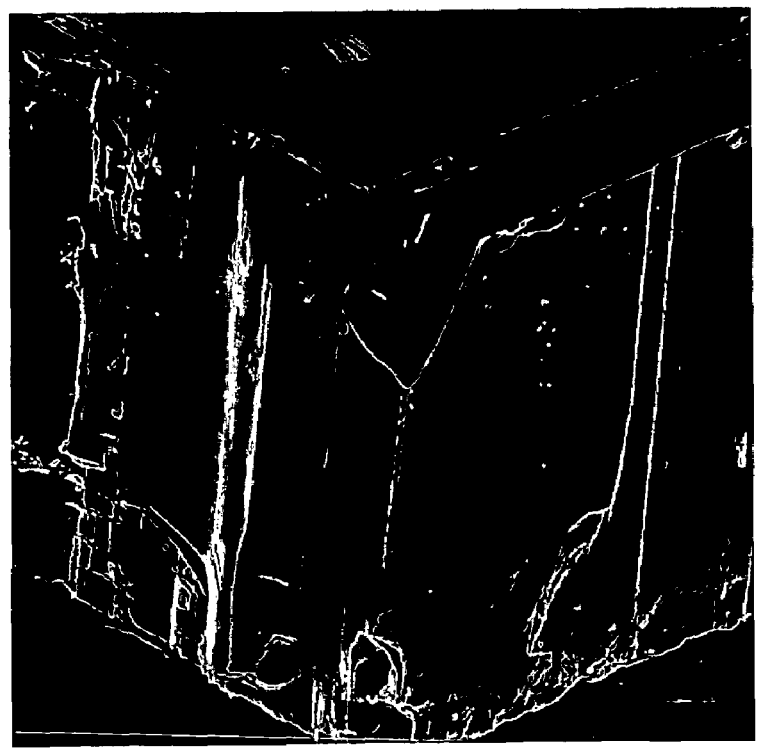
FIG. 6B is an enlarged photograph of portion A in the photograph 6A.

Next, the dicing tape 13, along with the individual light-emitting elements adhered thereto, was immersed for 5 minutes in a solution tank 8 containing the aqueous solution of hydrochloric acid 7, which is an acid solution whose main ingredient was hydrochloric acid. The aqueous solution of hydrochloric acid 7 was obtained by diluting hydrochloric acid with a concentration of about 30 wt % with water to a hydrochloric acid concentration of 15 wt % and storing the solution at a temperature in the range of from room temperature (25° C.) to not more than 80° C. (FIG. 4H).

By doing so, gaps were provided between the individual light-emitting elements and gallium compounds that had formed in the cross-section of the light-emitting elements were removed efficiently. The size of the gaps may be any size, as long as it allows the solution to penetrate inside, and preferably is not less than 10 μm, because the more solution penetrates inside, the better. In particular, when gallium nitride was used for the substrate 1, the effects of removal were more noticeable because the amount of adhered gallium compounds in the cross section was higher in comparison with using sapphire for the substrate.

In this manner, in the manufacturing method for a semiconductor device used in the embodiments of the present invention, immersion in an acid solution permits removal of gallium compounds adhered when laser light irradiation is used to form boundary grooves for separation into individual substrates. Therefore, when the semiconductor elements being manufactured are light-emitting elements, a decrease in the intensity of light can be prevented because the deposits adhered to the light-emitting face can be removed.

In the above-described embodiments, explanations were provided for a case, in which sapphire or gallium nitride were used in the substrate. However, gallium nitride-based compounds, gallium arsenic compounds, and gallium phosphorus compounds, etc. can be used in the substrate as well.

In addition, although the semiconductor devices used are light-emitting elements, the devices may be electronic elements such as light-receiving elements, transistors, etc.

The present invention provides an efficient method for manufacturing a semiconductor device, in which a laser beam is used to dice a substrate having semiconductor layers formed thereon, with gallium contained in at least one of the substrate and the semiconductor layers, and is particularly suitable as a method for manufacturing light-emitting elements that utilizes sapphire and gallium compound semiconductors in the substrate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor device using irradiation with laser light to partition a substrate having semiconductor layers formed thereon, with gallium contained in at least one of the substrate and the semiconductor layers, wherein the method comprises:
    forming grooves to be used as boundaries between individual substrates by irradiating the substrate along partitioning locations with laser light,
    removing gallium compounds as deposits generated by the irradiation with laser light by immersing the grooved substrate into an acid solution, and
    partitioning the substrate into individual substrates along the boundaries where the grooves are formed,
    wherein the semiconductor device is a light-emitting element.

2. The method for manufacturing a semiconductor device according to claim 1, wherein the substrate is partitioned into individual substrates along the boundaries where the grooves are formed after removing it from the acid solution.

3. The method for manufacturing a semiconductor device according to claim 1 wherein, upon partitioning into individual substrates along the boundaries where the grooves are formed, the substrates are immersed in an acid solution.

4. The method for manufacturing a semiconductor device according to claim 1, wherein locations irradiated with laser light have grooves formed by irradiation on a side opposite a side on which the semiconductor layers are formed.

5. The method for manufacturing a semiconductor device according to claim 1, wherein the grooves are formed by performing irradiation with laser light in an oblique direction so as to form quasi V-shaped cross-sections.

6. The method for manufacturing a semiconductor device according to claim 1, wherein locations irradiated with laser light have grooves formed by irradiation on a side on which the semiconductor layers are formed.

7. The method for manufacturing a semiconductor device according to claim 1, wherein the acid solution is a solution whose main ingredient is hydrochloric acid or nitric acid.

8. The method for manufacturing a semiconductor device according to claim 1, wherein the grooves extend to not less than 30% of the thickness of the substrate.

9. The method for manufacturing a semiconductor device according to claim 1, wherein the light-emitting element has an n-type semiconductor layer and a p-type semiconductor layer formed on top of the substrate.

10. The method for manufacturing a semiconductor device according to claim 9, wherein a Pt layer and, on top of it, a rhodium layer, are formed in the p-type semiconductor layer region in order to establish an ohmic contact with the p-type semiconductor layer, thereby producing a dual layer structure acting as a reflective film, with a p-type electrode composed of gold formed thereon.

11. The method for manufacturing a semiconductor device according to claim 9, wherein a Ti layer and, on top of it, a Au layer, are formed in the n-type semiconductor layer region in order to establish an ohmic contact with the n-type semiconductor layer region in order to establish an ohmic contact with the n-type semiconductor layer, thereby producing a dual layer structure acting as an n-type electrode.

* * * * *